United States Patent [19]
Nichols

[11] Patent Number: 6,082,497
[45] Date of Patent: Jul. 4, 2000

[54] MANUAL WAFER LIFT

[75] Inventor: Ernest C. Nichols, Boise, Id.

[73] Assignee: Micron Technology, Inc., Boise, Id.

[21] Appl. No.: 08/834,291

[22] Filed: Apr. 15, 1997

Related U.S. Application Data

[63] Continuation of application No. 08/546,724, Oct. 23, 1995, Pat. No. 5,626,207.

[51] Int. Cl.$^7$ ..................................................... B66B 11/08
[52] U.S. Cl. ........................................... 187/263; 414/417
[58] Field of Search ..................................... 187/251, 263, 187/250; 221/76, 92; 257/48, 777, 723, 686; 414/935, 938, 417

[56] References Cited

U.S. PATENT DOCUMENTS

| Re. 33,341 | 9/1990 | Lee et al. .................................. 414/417 |
| 4,082,394 | 4/1978 | Gedney et al. .......................... 257/723 |
| 4,436,474 | 3/1984 | Brossman, Jr. et al. ................. 414/417 |
| 4,570,058 | 2/1986 | Havassy .................................... 235/479 |
| 5,144,228 | 9/1992 | Sonna et al. .............................. 257/48 |
| 5,626,207 | 5/1997 | Nichols ..................................... 187/263 |

OTHER PUBLICATIONS

H–Square Corporation Catalog, 1994–1995 Edition, pp. 5–10.

Primary Examiner—Kenneth W. Noland
Attorney, Agent, or Firm—Ormiston Korfanta & Holland, PLLC

[57] ABSTRACT

A wafer lift for lifting a series of vertically oriented wafers arranged parallel to one another in a cassette. The wafer lift comprises a lift plate and an actuator mechanism for raising the lift plate. The lift plate has a contact surface for engaging the edge of each of the wafers. The contact surface extends upward at a predetermined angle so that, when the lift plate is raised and the contact surface engages the edges of the wafers, each wafer is lifted incrementally higher than the preceding wafer. The actuator mechanism includes a bell crank rotatable about a pivotal axis for transforming rotational motion into translational motion. The bell crank has first and second crank arms that extend radially from the pivotal axis and an arcuate member that extends circumferentially between and joining the crank arms. Thus, the arcuate member forms the circumferential perimeter of the bell crank. The actuator mechanism also includes a transmission mechanism for transmitting the translational motion of the perimeter of the bell crank to the lift plate to raise the lift plate so that the contact surface engages the edges of the wafers. The transmission mechanism consists of a lift belt linking the bell crank and the lift plates. One end of the lift belt is attached to the perimeter of the bell crank and the other end is operatively connected to the lift plate for vertical movement therewith. The lift belt runs under a first roller and over a second roller. The belt has a first segment between the bell crank and the first roller, a second segment between the first and second rollers, and a third segment between the second roller and the lift plate. The rollers are configured so that rotation of the bell crank about its pivotal axis pulls the first segment of the belt upward, the second segment downward and the third segment upward to raise the lift plate to engage and lift the wafers.

7 Claims, 4 Drawing Sheets

MANUAL WAFER LIFT

This application is a continuation of application number 08/546,724, filed Oct. 23, 1995, now U.S. Pat. No. 5,626,207.

FIELD OF THE INVENTION

The invention relates generally to semiconductor fabrication and processing equipment and, more particularly, to an improved manual wafer lift.

BACKGROUND OF THE INVENTION

Semiconductor wafers are typically stored, processed and/or transported in cassettes that have a series of parallel slots, each of which receives and holds a single wafer. The cassettes are also commonly referred to as wafer "boats", particularly for those used in wet processing operations. Most wafer cassettes hold up to twenty five wafers. The gap between adjacent wafers varies between about ⅛" for six inch diameter wafers to about ¼" for eight inch diameter wafers. During the manufacturing process, individual wafers are inscribed or imprinted with identifying information, such as lot numbers and processing and test information. This information, which is typically located along the perimeter of the wafer, must be read periodically by technicians, operators or processing machines. However, because of the close spacing of the wafers in a cassette, it is difficult to read the information without removing the wafers from the cassette or otherwise exposing the perimeter of the wafers. Manually lifting the individual wafers is time consuming and expensive and increases the risk of contaminating the wafers.

Conventional wafer lifts, such as the H-Square Corp. "Wafer Escalator", utilize a passive mechanism wherein a stationary angled contact surface engages and lifts the wafers as the cassette is lowered onto the escalator. The present invention provides an alternative to such passive devices by using an active lifting mechanism that allows the operator to raise the wafers after the cassette has been placed on the machine. Thus, the operator is able to better control the extent to which the individual wafers are raised and lowered.

SUMMARY OF THE INVENTION

The present invention provides a new lift for lifting a series of vertically oriented wafers arranged parallel to one another in a cassette. Broadly stated, the wafer lift comprises a lift plate and an actuator mechanism for raising the lift plate. The lift plate has a contact surface for engaging the edge of each of the wafers. The contact surface extends upward at a predetermined angle so that, when the lift plate is raised and the contact surface engages the edges of the wafers, each wafer is lifted incrementally higher than the preceding wafer. In one aspect of the invention, the actuator mechanism includes a bell crank rotatable about a pivotal axis for transforming rotational motion into translational motion. The bell crank has first and second crank arms that extend radially from the pivotal axis and an arcuate member that extends circumferentially between and joining the crank arms. Thus, the arcuate member forms the circumferential perimeter of the bell crank. The actuator mechanism also includes a transmission mechanism for transmitting the translational motion of the perimeter of the bell crank to the lift plate to raise the lift plate so that the contact surface engages the edges of the wafers.

In another aspect of the invention, the transmission mechanism consists of a lift belt linking the bell crank and the lift plates. One end of the lift belt is attached to the perimeter of the bell crank and the other end is operatively connected to the lift plate for vertical movement therewith. The lift belt runs under a first roller and over a second roller. The belt has a first segment between the bell crank and the first roller, a second segment between the first and second rollers, and a third segment between the second roller and the lift plate. The rollers are configured so that rotation of the bell crank about its pivotal axis pulls the first segment of the belt upward, the second segment downward and the third segment upward to raise the lift plate to engage and lift the wafers.

In one preferred version of the invention, the wafer lift is actuated by pulling down on a lever type handle attached to the bell crank to rotate the bell crank and thereby raise the lift plate to engage and lift the wafers. When the handle is lowered, the bell crank returns to its rest position under the weight of the lift plate and the wafers.

Another version of the invention utilizes a pair of upright lift plates that are positioned parallel to one another above the bell crank. Each lift plate is rigidly connected to the other and slidably mounted on a plurality of vertical shafts, for coordinated reciprocal vertical movement thereon. One end of the lift belt is attached to the perimeter of the bell crank and the other end is attached to a connector that rigidly connects the lift plates. The lift belt runs under the first roller, which is located below the horizontal plane intersecting the pivotal axis of the bell crank, and over the second roller, which is located above the connector. The belt has a substantially vertical first segment between the bell crank and the first roller, a substantially vertical second segment between the first and second rollers, and a substantially vertical third segment between the second roller and the lift plate. Thus, upon rotation of the bell crank about its pivotal axis, the first segment of the belt is pulled upward, the second segment is pulled downward and the third segment is pulled upward to raise the lift plates to engage and lift the wafers.

DETAILED DESCRIPTION OF THE INVENTION

Figure 1:
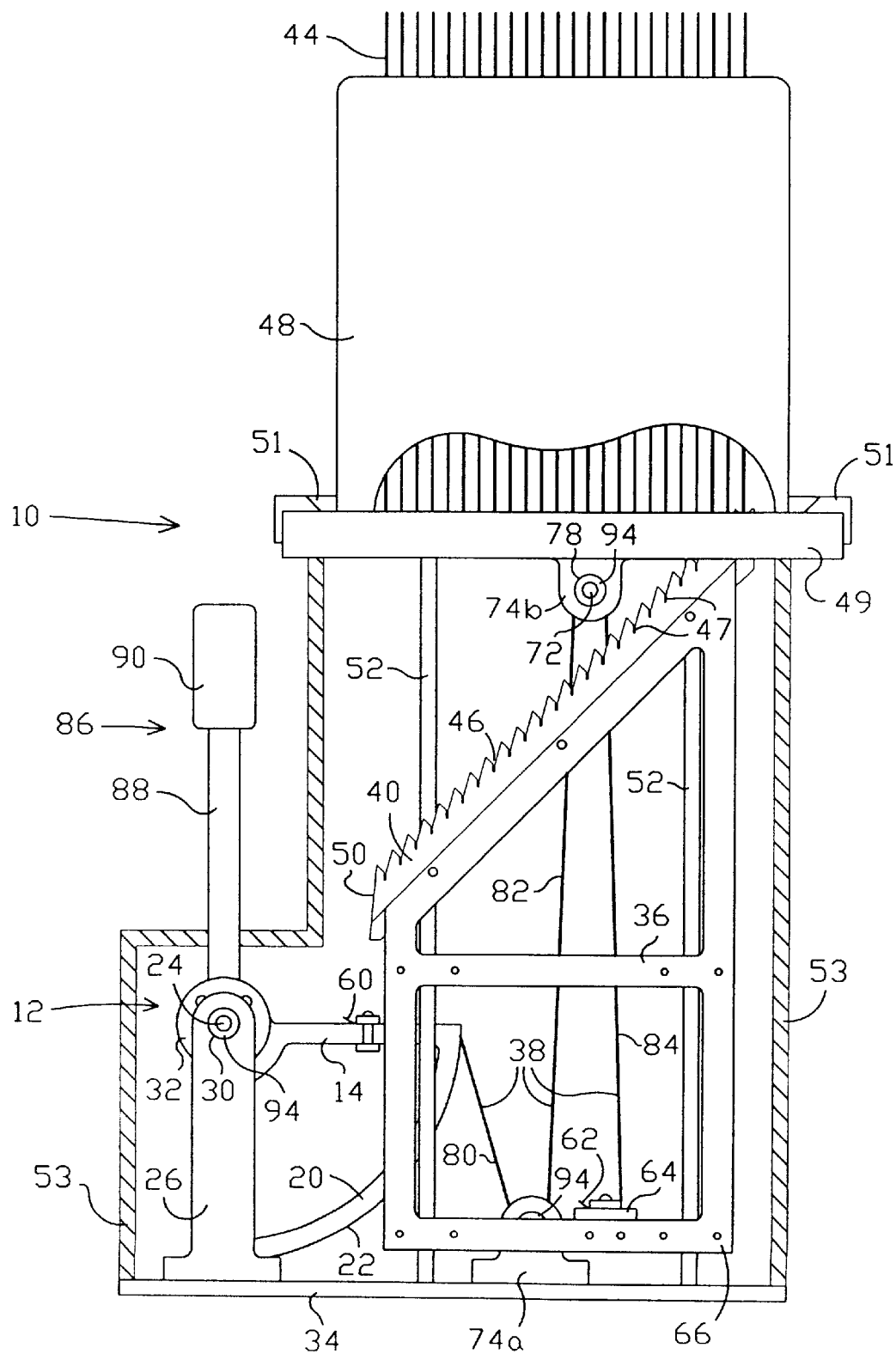
FIG. 1 is a side elevation view illustrating the wafer lift with the lift plates and wafers in the lowered position.

Referring to FIGS. 1–5, the invented manual wafer lift is indicated generally by reference numeral 10. Bell crank 12 includes first crank arm 14 and second crank arm 16. First and second crank arms 14, 16 extend radially from a pivotal axis 18 of bell crank 12. Preferably, as shown on FIG. 1, first and second crank arms 14, 16 are formed at right angles to one another. An arcuate member 20 extends circumferentially between and joins first and second crank arms 14, 16. Arcuate member 20 thus defines the circumferential perimeter 22 of bell crank 12. Bell crank 12 is mounted on and supported by bell crank shaft 24. Crank shaft 24 is mounted on and supported at its ends by crank shaft hangers 26. Crank shaft hangers 26 are generally flat vertical stanchions mounted on base plate 34. Crank shaft 24 extends along pivotal axis 18 through bore 28 in bell crank 12 and holes 30 in crank shaft hangers 26. In the preferred embodiment illustrated in FIG. 1, bell crank 12 is fixedly mounted on crank shaft 24 by fastening bell crank 12 to flange 32 on crank shaft 24. In this configuration, upon rotation of bell crank 12, crank shaft 24 turns in holes 30 in crank shaft hangers 26. Alternatively, bell crank 12 is rotatably mounted on crank shaft 24, which is then fixedly attached to crank shaft hangers 26. In this alternative configuration, bell crank 12 rotates on crank shaft 24.

Figure 3:
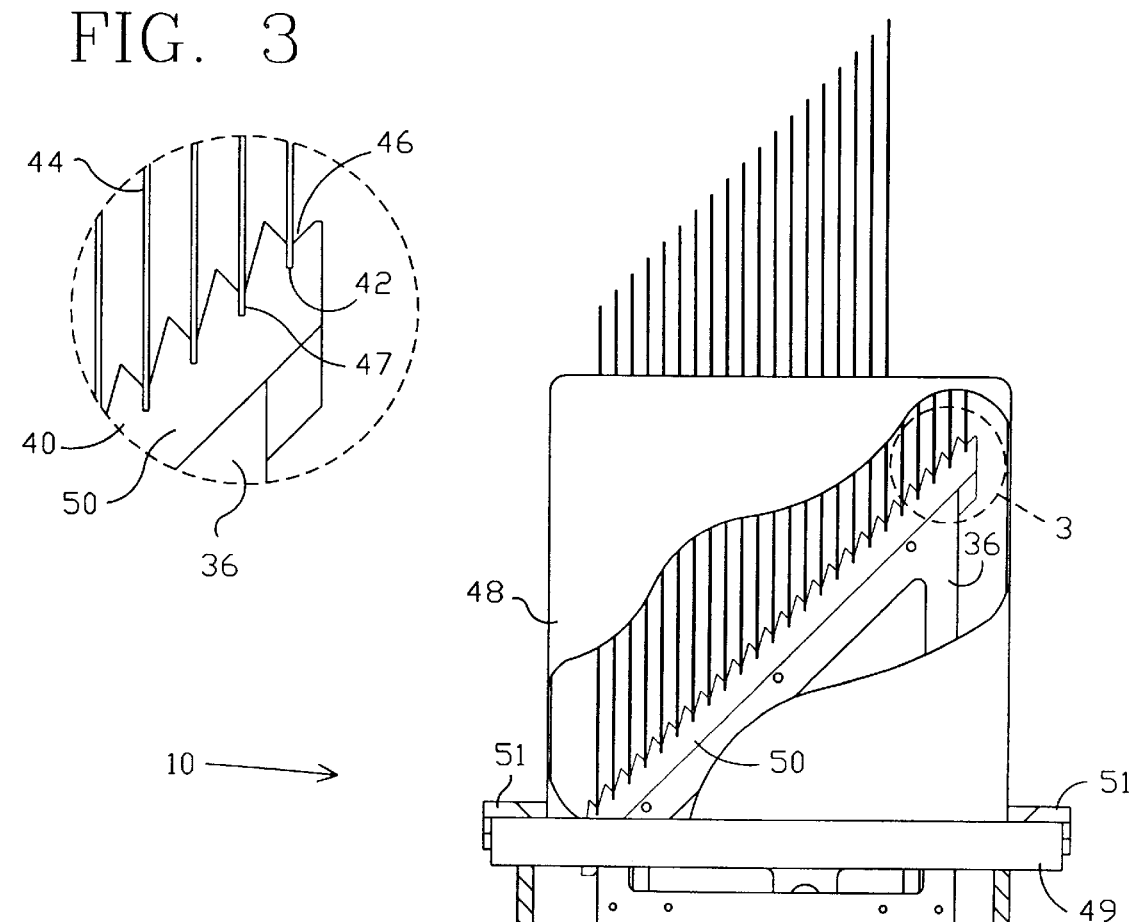
FIG. 3 is a detail view of the interface between the wafers and the contact surface of the lift plates.
Figure 2:
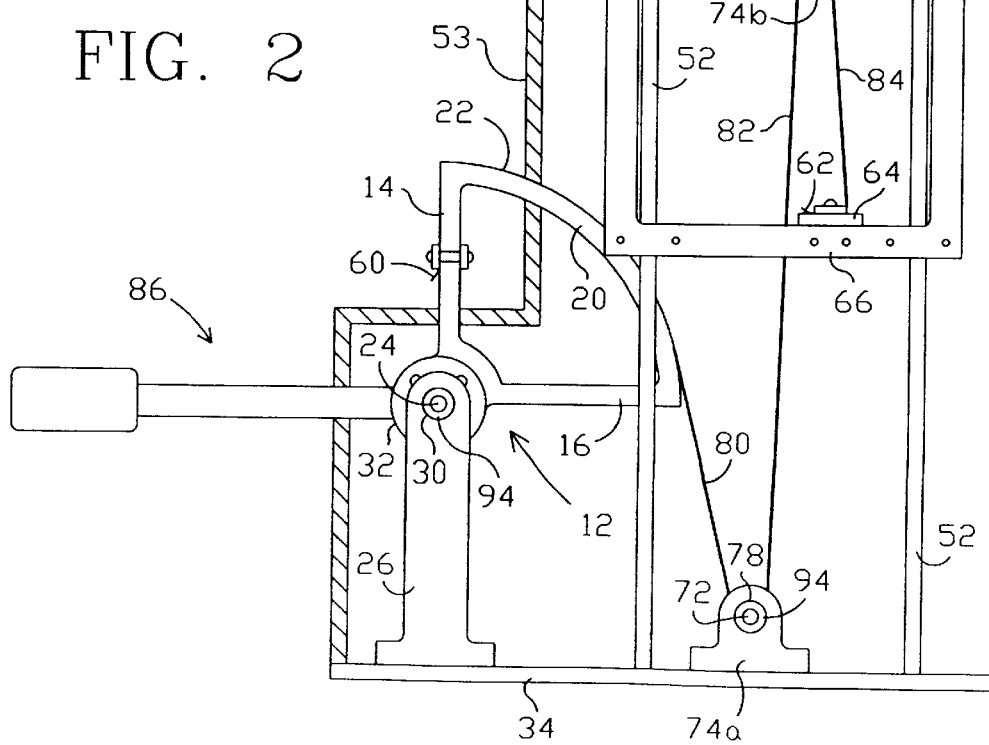
FIG. 2 is a side elevation view illustrating the wafer lift with the lift plates and wafers in the raised position.
Figure 4:
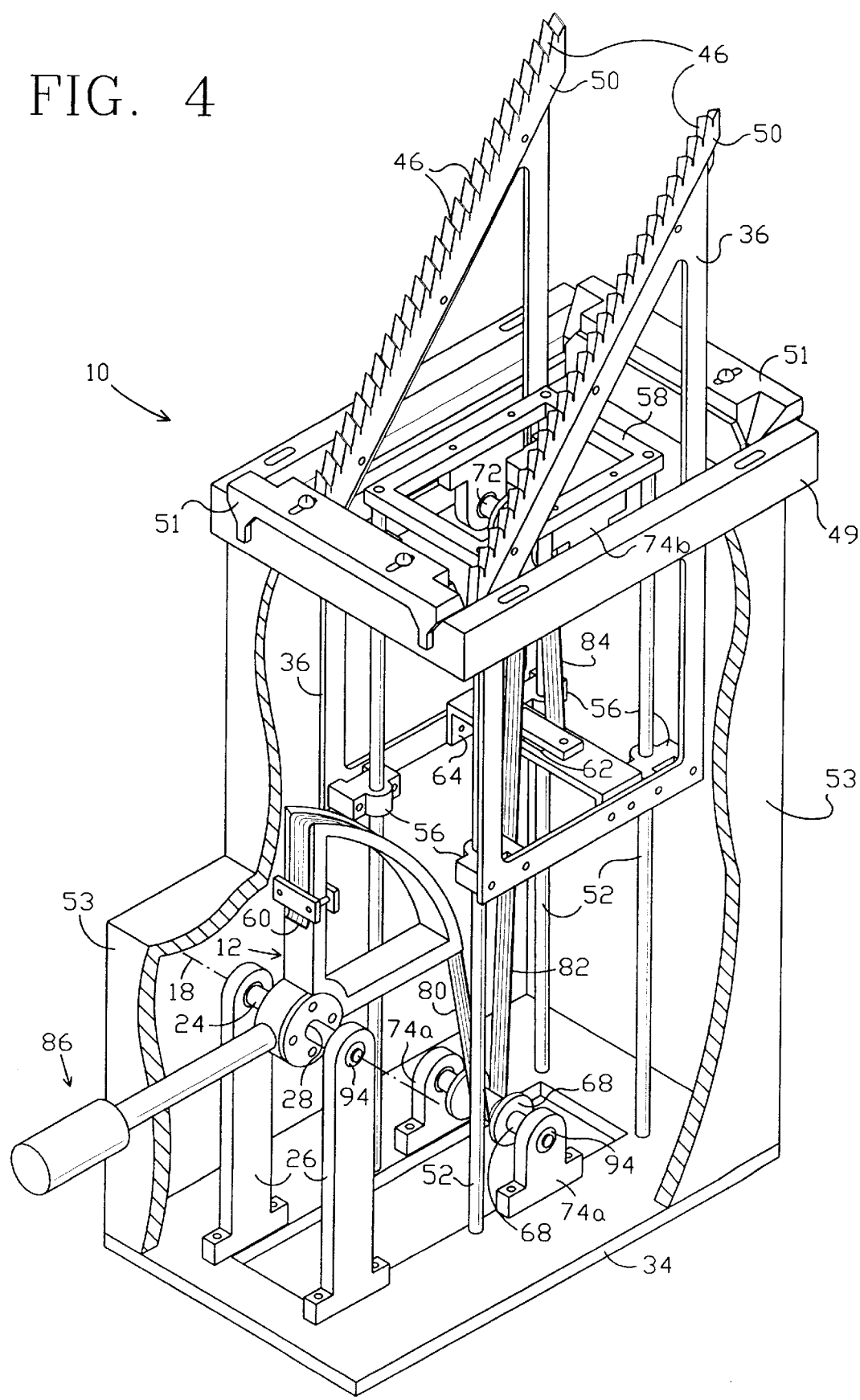
FIG. 4 is a perspective view of the wafer lift with the lift plates in the raised position.
Figure 5:
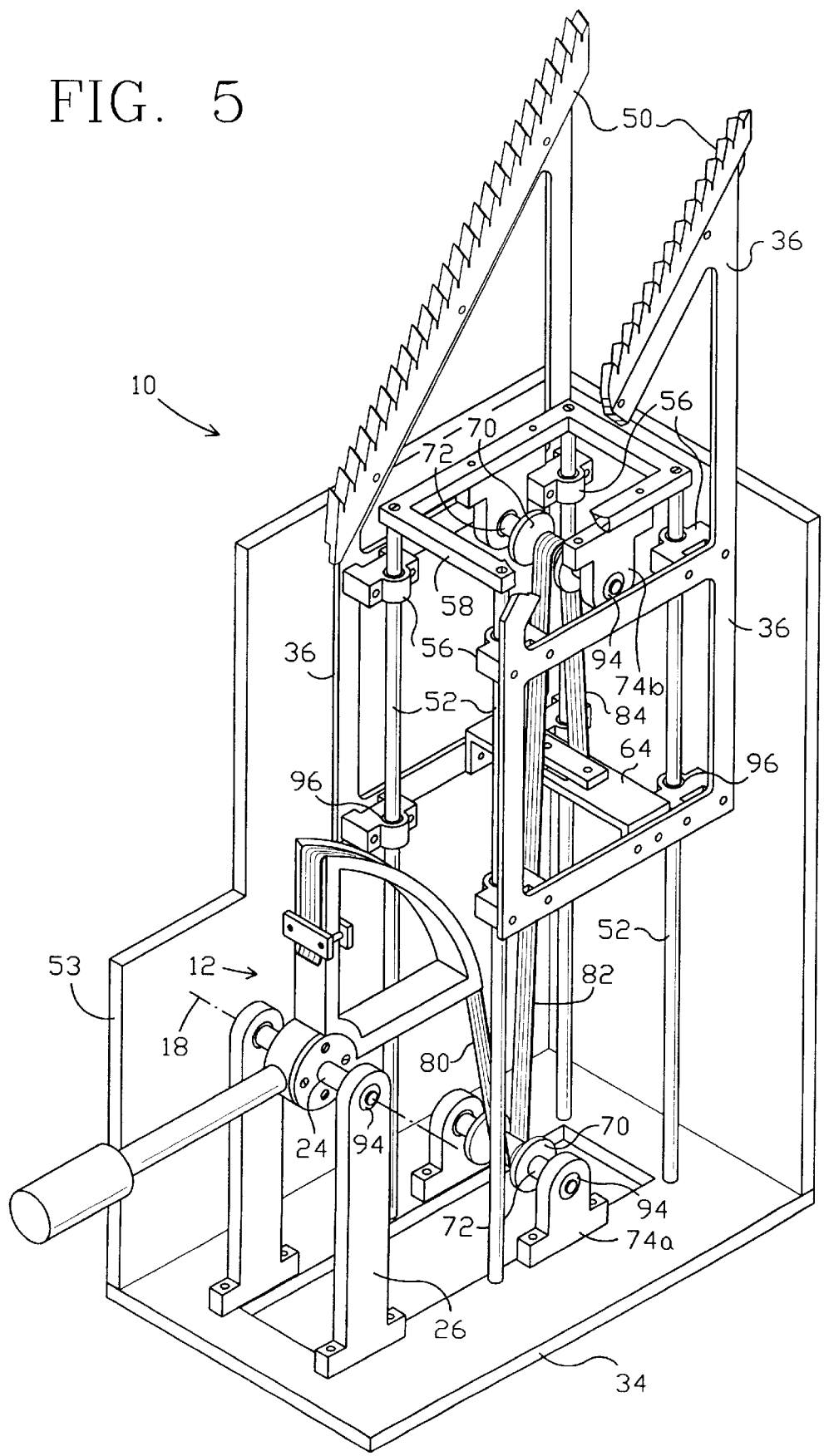
FIG. 5 is a perspective view of the wafer lift as in FIG. 4 with a portion of the upper mechanism cut-away to show additional working elements of the lift.

A pair of trapezoid shaped lift plates 36 are positioned above bell crank 12. The upper or "contact" surface 40 of lift plates 36 engages the edges 42 of wafers 44, as best shown in FIG. 3. Contact surface 40 extends upward at a predetermined angle to form a ramp so that, when lift plates 36 are raised and contact surface 40 engages wafers 44, each wafer is lifted incrementally higher than the preceding wafer. The resulting stair step configuration of the wafers is illustrated in FIG. 2. Contact surface 40 may be made of a friction promoting material or, preferably, contact surface 40 includes a series of notches 46 having slots 47 at the bottom thereof to securely engage the edges 42 of wafers 44 when lift plates 36 are raised.

The horizontal spacing of notches 46 may be made to correspond to the spacing of wafers 44 in wafer cassette 48 so that the edge 42 of each wafer 44 is aligned with and engaged by the corresponding notch 46 on contact surface 40. In this way, wafers 44 can move straight up and down to prevent wafers 44 from bending or binding in the carrier slots in wafer cassette 48. Contact surface 40 may be formed as an integral part of lift plates 36 or as a separate "gripper" piece 50 mounted on lift plates 36.

For 8" wafers held in a conventional wafer cassette, wherein the gap between the wafers is approximately ¼", contact surface 40 extends upward at an angle of approximately 45°. When lift plates 36 are raised, each wafer is, therefore, lifted approximately ¼" higher than the preceding wafer. This height difference is generally sufficient to allow the operator to see the wafer identification numbers or other information typically scribed or printed on the top of each wafer. The angle of contact surface 40 may be changed to vary the incremental height difference between wafers as may be desired or necessitated by the particular application in which wafer lift 10 is used.

Lift plates 36 are slidably coupled to vertical lift shafts 52. Lift shafts 52 extend through holes 54 in brackets 56 which are attached to lift plates 36. Lift shafts 52 extend between and are attached at their respective ends to top plate 58 and base plate 34.

Lift plates 36 are operatively coupled to bell crank 12 through belt 38. A first end 60 of belt 38 is attached to the perimeter 22 of bell crank 12, preferably at the junction between first crank arm 14 and arcuate member 20. For convenience, first end 60 of belt 38 extends over and is attached to the top of first crank arm 14 at its junction with arcuate member 20, as shown on FIG. 1. This configuration is functionally the same as if first end 60 of belt 38 was attached directly to the perimeter 22 of bell crank 12 at the junction between first crank arm 14 and arcuate member 20. A second end 62 of belt 38 is attached to the center portion of lift bracket 64. Lift bracket 64 is a flat generally U-shaped plate extending between and rigidly connecting lower side rails 66 of lift plates 36.

Starting at bell crank 12, lift belt 38 runs under a first roller 68 and over a second roller 70. First roller 68 is positioned adjacent to perimeter 22 of bell crank 12 below the point at which first end 60 of belt 38 is attached to bell crank 12. Second roller 70 is positioned above lift bracket 64. First and second rollers 68, 70 are mounted on and supported by roller shafts 72. Roller shafts 72 are mounted on and supported at their ends by roller shaft hangers 74a and 74b, respectively. Roller shaft hangers 74a are mounted on base plate 34. Roller shaft hangers 74b are mounted on top plate 58. Roller shafts 72 extend along a pivotal axis of rollers 68, 70 through the holes in roller shaft hangers 74a, 74b.

In operation, a wafer cassette 48 is placed onto cassette guide 49. Cassette guide 49 is mounted at the top of housing 53. Guide stops 51 are mounted on opposing sides of guide 49. Guide 49 and guide stops 51 and configured to securely support and hold wafer cassette 48 above contact surface 40 of lift plates 36. Preferably, guide stops 51 are adjustable as illustrated by slotted holes 55 to ensure the wafers are properly aligned to notches 46 in contact surface 40. The lifting operation of lift 10 is best illustrated with reference to three segments of belt 38. The first segment 80 is that portion of belt 38 between bell crank 12 and first roller 68. The second segment 82 is that portion of belt 38 between first roller 68 and second roller 70. The third segment 84 is that portion of belt 38 between second roller 70 and lift bracket 64. Preferably, rollers 68, 70 are positioned so that segments 80, 82 and 84 are substantially vertical. Bell crank 12 is actuated by handle 86. Handle 86 includes lever member 88 and knob 90. Bell crank 12 is rotated by pulling down on handle 86. Upon rotation of bell crank 12, first segment 80 of belt 38 is pulled upward, second segment 82 is pulled downward and third segment 84 is pulled upward, thereby raising lift plates 36 to engage and lift wafers 44. This motion can best be seen by comparing FIGS. 1 and 2. When handle 86 is raised, bell crank 12 returns to its resting position (shown in FIG. 1) under the weight of lift plates 36 and wafers 44.

Conventional bearings are used for all moving parts to minimize surface wear. For example, flanged bearings 94, which support bell crank shaft 24 and rollers 68, 70, is a single row flanged ball bearing, such as a Berg model B2-11-S, and linear bearings 96 on lift shafts 52 is a linear pillow block bearing assembly, such as Berg model LPA-1. Other conventional bearings may be substituted for those mentioned. The structural components of the wafer lift described above may be made of any suitable structurally stable corrosion resistant material, such as aluminum or stainless steel. Bearing surface materials are preferably made of stainless steel to minimize the risk of contaminating the wafers and to reduce wear on the contact surfaces.

There has been shown and described a new and improved manually operated wafer lift. While the invention has been shown and described with reference to the foregoing preferred embodiments, it will be apparent to those skilled in the art that other forms and details may be made thereto without departing from the spirit and scope of the invention as defined in the appended claims.

What is claimed is:

1. A wafer lift, comprising:

a lift plate having a contact surface angled upward so that when the lift plate is raised and the contact surface engages wafers, each wafer is lifted incrementally higher than the preceding wafer; and an actuator operatively coupled to the lift plate, the actuator operative to move between a first position wherein the lift plate is raised and a second position wherein the lift plate is lowered.

2. A wafer lift for lifting a plurality of vertically oriented wafers arranged parallel to one another in a cassette, comprising:

a lift plate having an angled contact surface;

a support structure configured to hold the cassette over the lift plate; and a bell crank operatively coupled to the lift plate, the bell crank operative to move between a first position wherein the lift plate is raised and a second position wherein the lift plate is lowered.

3. A wafer lift, comprising:

a lift plate having an angled contact surface;

a wafer cassette holder over the lift plate;

a bell crank; and a drive linkage connected between the lift plate and the bell crank.

4. A wafer lift according to claim 3, further comprising a lever connected to the bell crank for rotating the bell crank between the first and second positions.

5. A wafer lift according to claim 3, wherein the drive linkage comprises a belt having one end attached to the bell crank and another end attached to the lift plate.

6. A method for lifting wafers, comprising the steps of:

operatively coupling a ramp and a bell crank;

orienting the wafers vertically and arranging them parallel to one another;

positioning the wafers over the ramp; and rotating the bell crank to lift the ramp and engage and lift the wafers.

7. A method for lifting wafers, comprising the steps of:

orienting the wafers vertically and arranging them parallel to one another;

positioning the wafers over a ramp;

rotating a bell crank; and transmitting the motion of the bell crank to the ramp to lift the ramp and engage and lift the wafers.

* * * * *